United States Patent
Yamagishi et al.

(10) Patent No.: US 11,940,466 B2
(45) Date of Patent: Mar. 26, 2024

(54) CERAMIC, PROBE GUIDING MEMBER, PROBE CARD, AND SOCKET FOR PACKAGE INSPECTION

(71) Applicant: FERROTEC MATERIAL TECHNOLOGIES CORPORATION, Tokyo (JP)

(72) Inventors: Wataru Yamagishi, Tokyo (JP); Kazumasa Mori, Tokyo (JP); Shunichi Eto, Tokyo (JP)

(73) Assignee: FERROTEC MATERIAL TECHNOLOGIES CORPORATION, Tokyo (JP)

( * ) Notice: Subject to any disclaimer, the term of this patent is extended or adjusted under 35 U.S.C. 154(b) by 107 days.

(21) Appl. No.: 16/757,168

(22) PCT Filed: Oct. 19, 2018

(86) PCT No.: PCT/JP2018/039052
§ 371 (c)(1),
(2) Date: Apr. 17, 2020

(87) PCT Pub. No.: WO2019/078364
PCT Pub. Date: Apr. 25, 2019

(65) Prior Publication Data
US 2020/0241047 A1 Jul. 30, 2020

(30) Foreign Application Priority Data
Oct. 20, 2017 (JP) .................................. 2017-203052

(51) Int. Cl.
*G01R 1/073* (2006.01)
*C04B 35/583* (2006.01)
(Continued)

(52) U.S. Cl.
CPC ........ *G01R 1/07342* (2013.01); *C04B 35/583* (2013.01); *G01R 1/06755* (2013.01); *G01R 31/2886* (2013.01); *C04B 2235/9607* (2013.01)

(58) Field of Classification Search
CPC ............ G01R 1/07342; G01R 1/06755; G01R 31/2886; G01R 1/0466; G01R 1/07314;
(Continued)

(56) References Cited

U.S. PATENT DOCUMENTS 3,813,252 A * 5/1974 Lipp ....................... C23C 14/26
  252/502
4,540,674 A * 9/1985 Watanabe ............... C04B 35/80
  501/87

(Continued)

FOREIGN PATENT DOCUMENTS

CN 103626498 A * 3/2014
CN 105980331 A   9/2016

(Continued)

OTHER PUBLICATIONS

Zhang et al., "In situ Si3N4-SiC-BN composites: preparation, microstructures, and properties," Materials Science and Engineering A328 (Year: 2002).*

(Continued)

*Primary Examiner* — Lee E Rodak
(74) *Attorney, Agent, or Firm* — Birch, Stewart, Kolasch & Birch, LLP (57) ABSTRACT

A ceramic according to the present invention includes, in mass %, BN: 20.0 to 55.0%, SiC: 5.0 to 40.0%, $ZrO_2$ and/or $Si_3N_4$: 3.0 to 60.0%. The ceramic has a coefficient of thermal expansion at −50 to 500° C. of $1.0×10^{-6}$ to $5.0×10^{-6}$/° C., is excellent in low electrostatic properties ($10^6$ to $10^{14}$ Ω·cm in volume resistivity) and free-machining properties, and is thus suitable to be used for, for example, a probe guiding (Continued)

member for guiding probes of a probe card, and a socket for package inspection.

20 Claims, 3 Drawing Sheets (51) Int. Cl.
*G01R 1/067* (2006.01)
*G01R 31/28* (2006.01)

(58) Field of Classification Search
CPC .. G01R 1/07371; G01R 1/073; C04B 35/583; C04B 2235/9607; C04B 35/6261; C04B 35/62625; C04B 35/62655; C04B 35/645; C04B 2235/3206; C04B 2235/3217; C04B 2235/3225; C04B 2235/3244; C04B 2235/3826; C04B 2235/386; C04B 2235/3873; C04B 2235/6567; C04B 2235/77; C04B 2235/94; C04B 2235/945; C04B 2235/96; C04B 35/593; C04B 35/488
See application file for complete search history.

(56) References Cited

U.S. PATENT DOCUMENTS

| | | | | |
|---|---|---|---|---|
| 4,885,264 | A | * | 12/1989 | Sindlhauser ....... B22D 11/0475 501/87 |
| 5,633,214 | A | | 5/1997 | Nishio et al. |
| 6,378,598 | B1 | | 4/2002 | Tonelli et al. |
| 2002/0177518 | A1 | | 11/2002 | Kwon et al. |
| 2004/0082205 | A1 | | 4/2004 | Nishihata et al. |
| 2005/0130829 | A1 | | 6/2005 | Etoh et al. |
| 2008/0038517 | A1 | | 2/2008 | Nishihata et al. |
| 2012/0067145 | A1 | * | 3/2012 | Suzuki .................... G01R 3/00 73/866.5 |
| 2012/0247821 | A1 | | 10/2012 | Nomura et al. |
| 2013/0140508 | A1 | | 6/2013 | Shimada et al. |
| 2017/0057875 | A1 | | 3/2017 | Ishizuka et al. |

FOREIGN PATENT DOCUMENTS

| | | |
|---|---|---|
| EP | 1 518 844 A1 | 3/2005 |
| JP | 60-260197 A | 12/1985 |
| JP | 1-183465 A | 7/1989 |
| JP | 8-12440 A | 1/1996 |
| JP | 2000-500704 A | 1/2000 |
| JP | 2000-327402 A | 11/2000 |
| JP | 2005-119941 A | 5/2005 |
| JP | 2005-226031 A | 8/2005 |
| JP | 2006-169015 A | 6/2006 |
| JP | 2006-199586 A | 8/2006 |
| JP | 2007-332025 A | 12/2007 |
| JP | 2008-94688 A | 4/2008 |
| JP | 2012-215527 A | 11/2012 |
| JP | 2013-136503 A | 7/2013 |
| WO | WO 02/082592 A1 | 10/2002 |

OTHER PUBLICATIONS

English Machine Translation of CN-103626498-A (Year: 2014).*
Chen et al., "Effect of SiC content on mechanical properties and thermal shock resistance of BN—ZrO2—SiC composites," Materials Science & Engineering A 590, 2014 (Chen). (Year: 2014).*
International Preliminary Report on Patentability (Form PCT/IPEA/409) dated Jan. 28, 2020, for International Application No. PCT/JP2018/039052, with an English translation.
International Search Report (Form PCT/ISA/210) for International Application No. PCT/JP2018/039052, dated Nov. 13, 2018, with English translation.
Taiwanese Office Action and Search Report dated Apr. 24, 2020, for corresponding Taiwanese Patent Application No. 107137022, with partial English translation.
Written Opinion of the International Searching Authority (Form PCT/ISA/237) for International Application No. PCT/JP2018/039052, dated Nov. 13, 2018.

* cited by examiner

Example 1

FIGURE 4

Comparative Example 6

FIGURE 5

CERAMIC, PROBE GUIDING MEMBER, PROBE CARD, AND SOCKET FOR PACKAGE INSPECTION

TECHNICAL FIELD

The present invention relates to a ceramic, a probe guiding member, a probe card, and a socket for package inspection.

BACKGROUND ART

In a process of manufacturing precision instruments such as electronic components, a low electrostatic-property material for which antistatic measures are enforced is used so as to restrain damage to a product, occurrence of a defect in a product, and the like due to electrostatic discharge, and so as to prevent particles that are floating in an environment from being electrostatically attracted.

Figure 1:
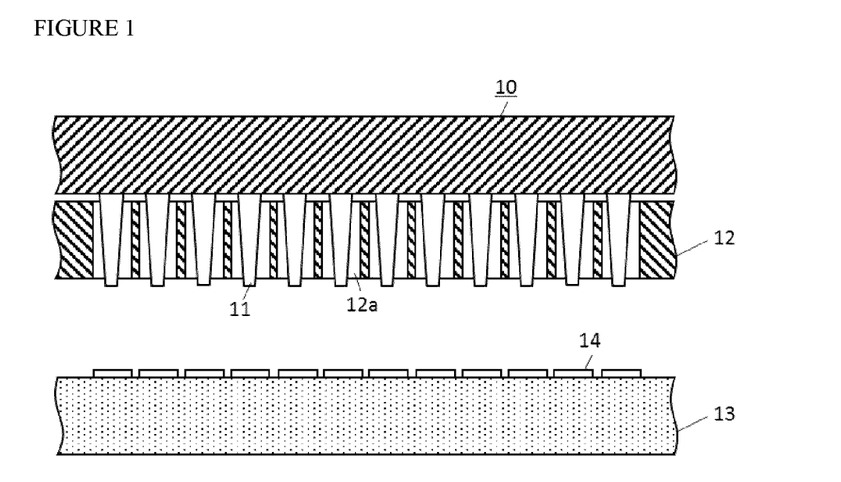
FIG. 1 is a cross-sectional view illustrating a configuration of a probe card as an example.
Figure 2:
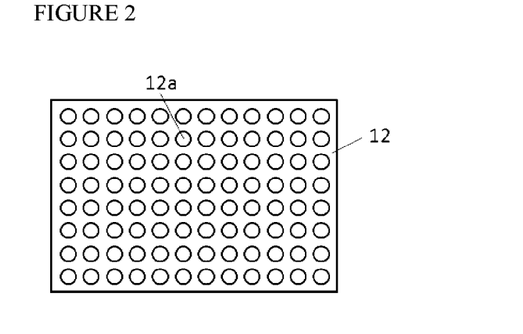
FIG. 2 is a top view illustrating a configuration of a probe guide as an example.

A probe card is used in, for example, an inspection process on IC chips. FIG. 1 illustrates a cross-sectional view illustrating a configuration of a probe card as an example, and FIG. 2 is a top view illustrating a configuration of a probe guide as an example. As illustrated in FIG. 1, a probe card 10 is an inspection jig that includes needle-shaped probes 11 and a probe guide (probe guiding member) 12 including through holes 12a for allowing the probes 11 to be inserted therethrough. By bringing the probes 11 into contact with IC chips 14 that are formed on a silicon wafer 13, an inspection of the IC chips 14 is conducted. At that time, the probe guide 12 is made of a low electrostatic-property material for which the antistatic measures are enforced.

As examples of normal low electrostatic-property materials, materials having volume resistivities of the order of $10^6$ to $10^{12}$ Ω·cm are widely used, such as resins to which conductive fillers are added (Patent Documents 1 and 2, etc.), and ceramic sintered bodies made by dispersing and sintering conductive ceramics (Patent Documents 3 to 5, etc.).

LIST OF PRIOR ART DOCUMENTS

Patent Document

Patent Document 1: JP2005-226031A
Patent Document 2: WO 2002/082592
Patent Document 3: JP2013-136503A
Patent Document 4: JP2008-094688A
Patent Document 5: JP2006-199586A

SUMMARY OF INVENTION

Technical Problem

As devices move toward finer design rules and higher performance in recent years, an antistatic-measures material used for an apparatus for manufacturing the devices is required not only to have low electrostatic properties but also to be improved in various properties such as free-machining properties, heat-resistant properties, mechanical properties, a thermal expansivity.

For example, an inspection efficiency of an inspection process on IC chips depends on how many probes can be brought into contact with IC chips at the same time. Hence, recent years have been seeing a practical application of a probe card on which tens of thousands of minute probes are set upright with high density by the micro-electromechanical systems (MEMS). As illustrated in FIG. 2 given above, the probe guide 12 needs to be provided with the through holes 12a at positions corresponding to the probes 11 of the probe card 10. Setting positions, a shape, and the like of the probes 11 of the probe card 10 vary according to specifications of the inspection apparatus, and setting positions, a shape, and the like of the through holes 12a vary accordingly. For example, in a case where the probes 11 have a pin shape, a circular hole is adapted for the through holes 12a. An inner diameter of the holes and a pitch of the holes depend on a kind or an arrangement of the probes 11; for example, there is a case where through holes having a diameter of 50 μm are arranged with a 60 μm pitch (a wall thickness between the through holes is about 10 μm). It is necessary to provide tens of thousands of such small through holes, which requires the free-machining properties.

A probe guide is required to be excellent in heat-resistant properties so that inspections are conducted in various temperature environments. The probe guide is also required to have a thermal expansivity as high as that of a silicon wafer. The probe guide is also required to be excellent in mechanical properties so that the probe guide can withstand contact and the like in an inspection. The above description is made mainly about the probe guide, and applications of which excellent low electrostatic properties and free-machining properties are required include a socket for inspection such as a socket for package inspection.

Here, in a case of the resins described in Patent Documents 1 and 2, to which conductive fillers are added, their rigidities and heat-resistant properties (operating temperatures) are low, and thus in a case where the resins are used for inspection jigs, a number of probes (withstand load) and an inspection temperature range are limited. In addition, such resins have low thermal conductivities and high thermal expansivities, and thus their raw workpieces expand due to heat during the machining, and a desired dimensional precision cannot be obtained in some cases after the machining.

In contrast, in a case of the ceramic including $Al_2O_3$ as its main phase (Patent Document 3) and the ceramics including $ZrO_2$ as their main phases (Patent Documents 4 and 5), although they are excellent in low electrostatic properties, their hardnesses are excessively high, and thus it is difficult to perform micromachining, particularly cutting by machining. For that reason, in a case where, for example, these materials are used to fabricate a probe guide, there is a problem in that its production time is extremely lengthened.

The present invention has an objective to provide a ceramic that is excellent in low electrostatic properties ($10^6$ to $10^{14}$ Ω·cm in volume resistivity) and free-machining properties, and to provide a probe guiding member, a probe card, and a socket for inspection that are made of the ceramic.

Solution to Problem

To achieve the objective described above, the present inventors conducted intensive studies and consequently obtained the following findings.

(a) First, the present inventors investigated a main phase for improving free-machining properties of a ceramic sintered body and found that a ceramic containing $Al_2O_3$ as its main phase and a ceramic containing $ZrO_2$ as its main phase each have a hardness so high that it is difficult to perform micromachining, while a ceramic sintered body containing BN as its main phase has an excellent free-machining properties. Therefore, the main phase of the ceramic is preferably BN.

(b) However, BN has a volume resistivity of the order of $10^{15}$ Ω·cm, which is excessively high, and thus if the ceramic is used continuously in an inspection process, electric charges are accumulated. The accumulated electric charges cannot be discharged gradually, and thus bring about electrostatic discharge. As a result, there is a problem in that current flows through an object being inspected instantaneously, and the object being inspected can be broken in some cases. Hence, in order to adjust the volume resistivity of the ceramic sintered body such that the volume resistivity falls within a range from $10^6$ to $10^{14}$ Ω·cm to give low electrostatic properties, dispersing grains being of the order of $10^3$ Ω·cm or less in a base material of the ceramic sintered body is effective. Notable examples of the grains to be dispersed include SiC, WC, C, TiN, $TiO_2$, and the like. However, as a simple substance, WC, C, TiN, and $TiO_2$ are each lower in volume resistivity than SiC. Therefore, it is preferable to disperse a proper amount of SiC in a ceramic containing BN as its main phase.

(c) Only dispersing the proper amount of SiC in the ceramic containing BN as its main phase may result in poor mechanical properties, and thus dispersing $ZrO_2$ and/or $Si_3N_4$ together with SiC is effective.

(d) For establishing compatibility between free-machining properties and mechanical properties, a close-grained ceramic sintered body is desirable. To this end, the ceramic is preferably fabricated by a hot pressing calcination method, in which the calcination is performed in a pressurized atmosphere.

The present invention is made based on the above findings, and the gist of the present invention is as follows.

(1) A ceramic including, in mass %:
BN: 20.0 to 55.0%;
SiC: 5.0 to 40.0%; and
$ZrO_2$ and/or $Si_3N_4$: 3.0 to 60.0%.

(2) The ceramic according to the above (1), wherein the ceramic has a coefficient of thermal expansion at −50 to 500° C. of $1.0 \times 10^{-6}$ to $5.0 \times 10^{-6}$/° C.

(3) The ceramic according to the above (1) or (2), wherein the ceramic has a volume resistivity of $10^6$ to $10^{14}$ Ω·cm.

(4) The ceramic according to any one of the above (1) to (3), wherein the ceramic has a coefficient of water absorption of 0.5% or less.

(5) A probe guiding member that guides probes of a probe card, the probe guiding member including:
a plate-shaped main body that is made of the ceramic according to any one of the above (1) to (4); and
the main body includes a plurality of through holes and/or slits through which the probes are to be inserted.

(6) A probe card including:
a plurality of probes; and
the probe guiding member according to the above (5).

(7) A socket for package inspection, wherein the socket for package inspection is made of the ceramic according to any one of the above (1) to (4).

Advantageous Effects of Invention

The present invention makes it possible to obtain a ceramic that is excellent in low electrostatic properties ($10^6$ to $10^{14}$ Ω·cm in volume resistivity) and free-machining properties, which is thus useful particularly to a probe guiding member, a probe card, and a socket for inspection.

DESCRIPTION OF EMBODIMENTS

1. Ceramic

A ceramic according to the present invention includes, in mass %, BN: 20.0 to 55.0%, SiC: 5.0 to 40.0%, $ZrO_2$ and/or $Si_3N_4$: 3.0 to 60.0%. In the following description, the symbol "%" for contents means "percent by mass."

BN: 20.0 to 55.0%

The ceramic according to the present invention is required to be a free-machining material that allows machining to be performed with a cemented carbide tool, and thus in order to give excellent free-machining properties to the ceramic, 20.0% or more of BN is contained as an essential component. However, if a content of BN is more than 55.0%, a material strength is decreased, arising a problem in machining through holes in that walls between through holes are collapsed. Accordingly, the content of BN is to range from 20.0 to 55.0%. A lower limit of the content of BN is preferably 25.0%, and more preferably 30.0%. An upper limit of the content of BN is preferably 50.0%, and more preferably 45.0%.

Note that types of BN include hexagonal BN (h-BN) and cubic BN (c-BN), but the c-BN has a high hardness, and it is thus preferable to use h-BN. Although no specific limitation is imposed on a grain diameter of BN, if BN has an excessively large grain diameter, a decrease in material strength may occur, and thus BN preferably has an average grain diameter of less than 5 μm.

SiC: 5.0 to 40.0%

SiC is an essential component to adjust a volume resistivity of the ceramic such that the volume resistivity falls within a range from $10^6$ to 10 Ω·cm. Accordingly, a content of SiC is to be 5.0% or more. However, if the content of SiC is more than 40.0%, the volume resistivity falls below $10^6$ Ω·cm, which not only is an undesirable volume resistivity for the low electrostatic-property material but also raises a problem in that a material hardness increases excessively to impair the free-machining properties. Accordingly, the content of SiC is to range from 5.0 to 40.0%. A lower limit of the content of SiC is preferably 10.0%, and more preferably 15.0%. An upper limit of the content of SiC is preferably 35.0%, and more preferably 30.0%.

Although no specific limitation is imposed on a grain diameter of SiC, if SiC has an excessively large grain diameter, variations in the volume resistivity become large, and thus SiC preferably has an average grain diameter of less than 2.0 μm. In addition, SiC is preferably present being dispersed in the ceramic mainly containing BN. A state of the dispersion can be checked by performing elementary analysis of Si using the energy dispersive X-ray spectrometry (EDX).

$ZrO_2$ and/or $Si_3N_4$: 3.0 to 60.0%.

$ZrO_2$ and $Si_3N_4$ are both components essential for enhancement in the mechanical properties of the ceramic. Accordingly, a content of $ZrO_2$ and/or $Si_3N_4$ is to be 3.0% or more. However, if the content of $ZrO_2$ and/or $Si_3N_4$ is more than 60.0%, the hardness increases excessively, and the free-machining properties deteriorate, which makes it impossible to form fine holes with high precision. Accordingly, the content of $ZrO_2$ and/or $Si_3N_4$ is to range from 3.0 to 60.0%. A lower limit of the content of $ZrO_2$ and/or $Si_3N_4$ is preferably 5.0%, and more preferably 10.0%. An upper limit of the content of $ZrO_2$ and/or $Si_3N_4$ is preferably 55.0%, and more preferably 50.0%. In a case where $ZrO_2$ and $Si_3N_4$ are both contained, their total content is to range from 3.0 to 60.0%.

Although no specific limitation is imposed on a grain diameter of $ZrO_2$ and/or $Si_3N_4$, if $ZrO_2$ and/or $Si_3N_4$ has an excessively large grain diameter, variations in the mechanical properties become large, and thus $ZrO_2$ and/or $Si_3N_4$ preferably has an average grain diameter of less than 2 μm. In addition, $ZrO_2$ and/or $Si_3N_4$ is preferably present being dispersed in the ceramic mainly containing BN. A state of the dispersion can be checked by the elementary analysis using EDX.

The ceramic according to the present invention contains, in addition to the components described above, a sintering agent necessary to obtain a close-grained ceramic. As the sintering agent, one or more kinds selected from, for example, aluminum oxide (alumina, $Al_2O_3$), magnesium oxide (magnesia, MgO), yttrium oxide (yttria, $Y_2O_3$), oxides of lanthanoid metals, and complex oxides such as spinel, can be used. Of these, a mixture of alumina and yttria, or a mixture of alumina and yttria further containing magnesia is preferable.

No specific limitation is imposed on a content of the sintering agent, but the content is desirably 1.0 to 15.0%. If the compounding amount is excessively small, the sintering becomes insufficient, decreasing the strength of the ceramic as a sintered body. In contrast, if the compounding amount is excessively large, grain boundary phases made of glass and crystals having low strengths increase, which also incurs a decrease in the strength of the ceramic. Furthermore, because the grain boundary phases have high volume resistivities, the excessively large compounding amount incurs an increase in the volume resistivity of the ceramic, adversely affecting the low electrostatic properties. The content of the sintering agent is preferably 3.0% or more, and more preferably 5.0% or more. The content of the sintering agent is preferably 12.0% or less, and more preferably 10.0% or less.

Contents of the respective components (mass %) can be measured by the ICP emission spectral analysis.

Coefficient of Thermal Expansion at −50 to 500° C.: $1.0 \times 10^{-6}$ to $5.0 \times 10^{-6}$/° C. In a case where the ceramic according to the present invention is used for a probe guide, the ceramic is required to have a coefficient of thermal expansion as high as that of a silicon wafer on which IC chips are formed. This is because, when a temperature in the inspection changes, positions of the IC chips move with thermal expansion of the silicon wafer. At the time, in a case where the probe guide has a coefficient of thermal expansion as high as that of the silicon wafer, the probe guide moves in synchronization with expansion and contraction of the silicon wafer, which enables a high precision inspection to be kept. This also applies to a case where the ceramic according to the present invention is used for a socket for inspection. Accordingly, a reference coefficient of thermal expansion at −50 to 500° C. is $1.0 \times 10^{-6}$ to $5.0 \times 10^{-6}$/° C.

Volume Resistivity: $10^6$ to $10^{14}$ Ω·cm

A feature of the ceramic according to the present invention is having low electrostatic properties, and its reference volume resistivity is $10^6$ to $10^{14}$ Ω·cm.

Coefficient of Water Absorption: 0.5% or less

The ceramic according to the present invention is required to be close-grained so that necessary mechanical properties are obtained. Sufficient mechanical properties may not be obtained if there are a large number of residual pores, and thus a reference coefficient of water absorption is 0.5% or less.

Flexural Strength: 200 MPa or more

In a case where the ceramic according to the present invention is used for a probe guide, the ceramic is required to have mechanical properties sufficient to withstand contact and a load of probes and the like in the inspection. This also applies to a case where the ceramic according to the present invention is used for a socket for inspection. Accordingly, a reference flexural strength is 200 MPa or more.

Free-Machining Properties

Regarding free-machining properties, a machining precision of performing cutting working using a cemented carbide micro drill to form 1000 (8×125 rows) through holes having diameters of 50 μm and 100 μm with a 60 μm pitch is evaluated by observing the through holes by a vision measuring system (e.g., Quick Vision from Mitutoyo Corporation). At that time, a case where the machining precision is within ±3.0 μm is determined to be good in the free-machining properties.

2. Method for Producing Ceramic

An example of a method for producing the ceramic according to the present invention will be described below.

Powders of BN, SiC, and $ZrO_2$ and/or $Si_3N_4$ are mixed together with the sintering agent by a known method such as a method using a ball mill. That is, the powders, solvent, resin-made balls each including a ceramic-made or iron-made core therein are mixed in a container to be formed into slurry. At that time, as the solvent, water or alcohol can be used. In addition, an additive such as a dispersant and a binder may be used as necessary.

The obtained slurry is formed into grains by a known method such as spray drying and a method using a decompression evaporator. That is, the slurry is spray-dried by a spray dryer to be formed into granules or is dried by the decompression evaporator to be formed into powder.

The obtained powder is sintered under a high temperature and a high pressure by, for example, a known method such as hot pressing and hot isostatic pressing (HIP) to be formed into a sintered ceramic body. In the case of the hot pressing, the powder may be calcined in a nitrogen atmosphere or in pressurized nitrogen. In addition, a temperature of the calcination preferably ranges from 1400 to 1900° C. If the temperature is excessively low, the sintering becomes insufficient, and if the temperature is excessively high, a problem such as liquating oxide components arises.

An appropriate pressing force ranges from 15 to 50 MPa. In addition, a duration of maintaining the pressing force is normally about 1 to 4 hours, which however depends on the temperature or the dimensions. Also in a case of the HIP, calcination conditions including the temperature and the pressing force are to be set as appropriate. Alternatively, a known calcination method such as a pressureless calcination method and an atmosphere pressing calcination may be adopted.

EXAMPLE

In order to confirm the effects of the present invention, powders of BN (h-BN), SiC, and $ZrO_2$ and/or $Si_3N_4$ were mixed together with the sintering agent (the mixture of alumina and yttria, or the mixture of alumina and yttria further containing magnesia) at various compounding ratios with water, dispersant, resin, and ceramic-made balls, and obtained slurries were each spray-dried by a spray dryer to be formed into granules. The obtained granules were charged into a graphite-made dice (mold) and subjected to hot pressing calcination in a nitrogen atmosphere, under a pressure of 30 MPa, at 1700° C., for 2 hours, to be formed into test materials being 150 mm long×150 mm wide×30 mm thick.

For reference, a resin to which commercial carbon fiber was added (Comparative example 8), a ceramic including commercial $Al_2O_3$ as its main phase (Comparative example 9), a ceramic including commercial $ZrO_2$ as its main phase (Comparative example 10) were prepared as test materials.

From the obtained test materials, test specimens were taken and subjected to various kinds of tests.

<Volume Resistivity>

A volume resistivity of each of the test materials was determined in conformity with JIS C2141.

<Thermal Expansivity>

A coefficient of thermal expansion of each of the test materials at −50 to 500° C. was determined in conformity with JIS R1618.

<Coefficient of Water Absorption>

A coefficient of water absorption of each of the test materials was determined in conformity with JIS C2141.

<Flexural Strength>

A three-point flexural strength of each of the test materials was determined in conformity with JIS R1601.

<Free-Machining Properties>

Regarding free-machining properties, a machining precision of performing cutting working using a cemented carbide micro drill to form 1000 (8×125 rows) through holes having diameters of 50 μm and 100 μm with a 60 μm pitch was evaluated by performing visual observation on the through holes (a case where the machining precision was within ±3.0 μm was determined to be good). At that time, a case where the machining precision was within ±3.0 pm was determined to be good in the free-machining properties and marked as "○," a case where the machining precision out of ±3.0 μm was marked as "Δ," and a case where the drilling failed due to a breakage of the drill or the like was marked as "x," which were written in Table 1.

TABLE 1

| Category | | SiC | C | $TiO_2$ | BN | $ZrO_2$ | $Si_3N_4$ | $Y_2O_3$ | $Al_2O_3$ | MgO | Volume resistivity (Ωcm) | Coefficient of water absorption (%) | Flexural strength (MPa) | Thermal expansivity (×10⁻⁶/ °C.) | Fine hole machining test φ50 um | φ100 um |
|---|---|---|---|---|---|---|---|---|---|---|---|---|---|---|---|---|
| Example | 1 | 8.5 | — | — | 36.0 | 48.0 | — | 5.6 | 1.9 | — | $9.1 \times 10^{13}$ | 0.0 | 318 | 4.6 | ○ | ○ |
| | 2 | 18.5 | — | — | 39.2 | 34.8 | — | 5.6 | 1.9 | — | $5.3 \times 10^{13}$ | 0.0 | 326 | 3.2 | ○ | ○ |
| | 3 | 21.3 | — | — | 40.0 | 31.2 | — | 5.6 | 1.9 | — | $3.9 \times 10^{12}$ | 0.0 | 335 | 3.2 | ○ | ○ |
| | 4 | 24.2 | — | — | 41.0 | 27.3 | — | 5.6 | 1.9 | — | $1.3 \times 10^{11}$ | 0.0 | 329 | 2.8 | ○ | ○ |
| | 5 | 10.9 | — | — | 38.4 | — | 43.2 | 5.6 | 1.9 | — | $1.2 \times 10^{13}$ | 0.0 | 555 | 1.1 | ○ | ○ |
| | 6 | 14.1 | — | — | 38.4 | — | 40.0 | 5.6 | 1.9 | — | $1.2 \times 10^{13}$ | 0.0 | 549 | 1.2 | ○ | ○ |
| | 7 | 15.2 | — | — | 38.4 | — | 38.9 | 5.6 | 1.9 | — | $5.9 \times 10^{11}$ | 0.0 | 512 | 1.0 | ○ | ○ |
| | 8 | 16.3 | — | — | 38.4 | — | 37.8 | 5.6 | 1.9 | — | $4.2 \times 10^{10}$ | 0.0 | 503 | 1.1 | ○ | ○ |
| | 9 | 17.4 | — | — | 38.4 | — | 36.7 | 5.6 | 1.9 | — | $8.0 \times 10^{9}$ | 0.0 | 532 | 1.3 | ○ | ○ |
| | 10 | 19.1 | — | — | 37.4 | — | 33.6 | 7.2 | 2.7 | — | $9.1 \times 10^{8}$ | 0.0 | 510 | 1.2 | ○ | ○ |
| | 11 | 21.2 | — | — | 37.4 | — | 31.5 | 7.2 | 2.7 | — | $1.1 \times 10^{8}$ | 0.0 | 519 | 1.3 | ○ | ○ |
| | 12 | 10.4 | — | — | 25.5 | — | 56.6 | 5.6 | 1.9 | — | $4.6 \times 10^{12}$ | 0.0 | 611 | 1.6 | ○ | ○ |
| | 13 | 22.3 | — | — | 51.2 | — | 16.6 | 5.4 | 2.7 | 1.8 | $6.8 \times 10^{10}$ | 0.0 | 230 | 1.3 | ○ | ○ |
| | 14 | 36.2 | — | — | 25.5 | 25.5 | 4.5 | 5.5 | 1.8 | 1.0 | $4.3 \times 10^{6}$ | 0.0 | 469 | 3.6 | ○ | ○ |
| | 15 | 15.0 | — | — | 38.8 | 18.8 | 19.9 | 5.6 | 1.9 | — | $8.5 \times 10^{11}$ | 0.0 | 473 | 2.9 | ○ | ○ |
| | 16 | 24.2 | — | — | 41.0 | 27.3 | — | 5.6 | 1.9 | — | $3.4 \times 10^{11}$ | 0.8 | 253 | 2.7 | ○ | ○ |
| Comparative Example | 1 | —* | — | — | 32.6 | 47.4 | 12.5 | 5.6 | 1.9 | — | $1.9 \times 10^{15}$# | 0.0 | 344 | 4.7 | ○ | ○ |
| | 2 | —* | — | — | 47.7 | — | 44.8 | 5.6 | 1.9 | — | $2.0 \times 10^{15}$# | 0.0 | 447 | 1.4 | ○ | ○ |
| | 3 | 2.3* | — | — | 34.1 | 56.1 | — | 5.6 | 1.9 | — | $7.7 \times 10^{14}$# | 0.0 | 322 | 4.8 | ○ | ○ |
| | 4 | 43.8* | — | — | 12.4* | 16.5 | 17.4 | 6.3 | 1.8 | 1.8 | $1.6 \times 10^{5}$# | 0.0 | 656 | 3.4 | x Drill broken | Δ Precision ≥± 3 um |
| | 5 | —* | 3.8 | — | 39.2 | — | 49.5 | 5.6 | 1.9 | — | $9.5 \times 10^{15}$# | 0.0 | 269 | 1.3 | ○ | ○ |
| | 6 | —* | 7.8 | — | 39.9 | — | 44.8 | 5.6 | 1.9 | — | $8.0 \times 10^{6}$ | 0.0 | 138# | 1.3 | Δ Wall broken | Δ Wall broken |
| | 7 | —* | — | 23.1 | — | — | 69.4* | 3.7 | 1.9 | 1.9 | $1.2 \times 10^{15}$# | 0.0 | 741 | 2.8 | x Drill broken | x Drill broken |

TABLE 1-continued

| Category | Content (mass %) SiC C TiO$_2$ BN ZrO$_2$ Si$_3$N$_4$ Y$_2$O$_3$ Al$_2$O$_3$ MgO | Volume resistivity (Ωcm) | Coefficient of water absorption (%) | Flexural strength (MPa) | Thermal expansivity (×10$^{-6}$/°C.) | Fine hole machining test φ50 um | φ100 um |
|---|---|---|---|---|---|---|---|
| 8 | Antistatic-measures peek (resin) | 1.2 × 10$^9$ | 0.1 | 142# | 40.0# | Δ Wall broken Precision ≥± 3 um | Δ Wall broken Precision ≥± 3 um |
| 9 | Antistatic-measures Al$_2$O$_3$ | 5.6 × 10$^{10}$ | 0.0 | 475 | 7.4# | x Drill broken | x Drill broken |
| 10 | Antistatic-measures ZrO$_2$ | 9.8 × 10$^8$ | 0.0 | 865 | 8.6# | x Drill broken | x Drill broken |

The mark "*" indicates that its value fell out of the range specified in the present invention.

The mark "#" indicates that its property did not satisfy the range desired in the present invention.

Figure 3:
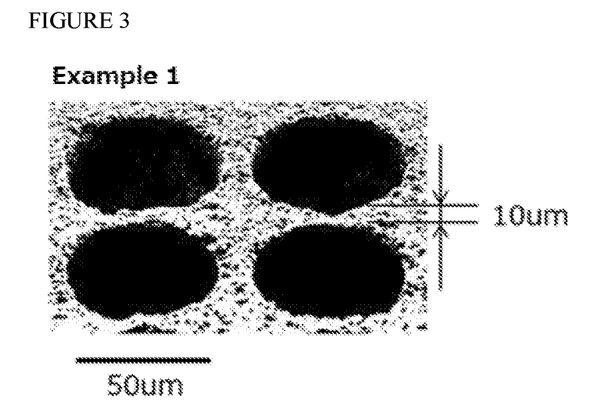
FIG. 3 is a picture of Example 1 after a micromachining test.
Figure 4:
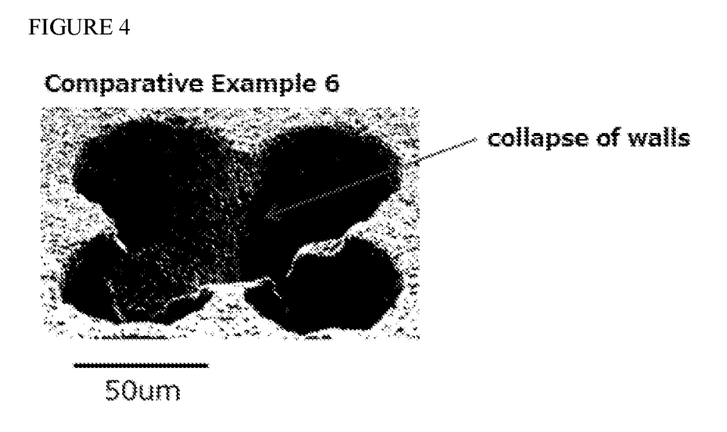
FIG. 4 is a picture of Comparative example 6 after the micromachining test.
Figure 5:
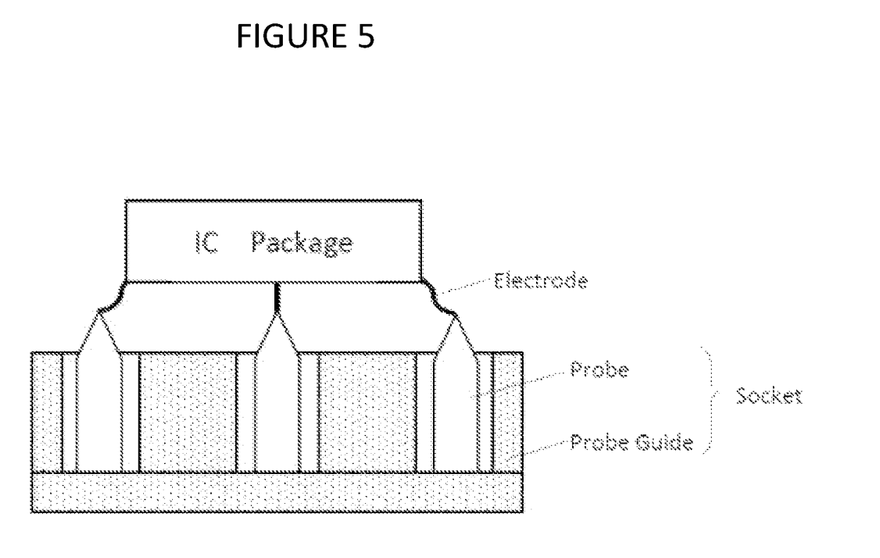
FIG. 5 shows a socket for package inspection according to an embodiment of the present invention.

FIG. 3 is a picture of Example 1 after a refining test, and FIG. 4 is a picture of Comparative example 6 after the refining test.

As shown in Table 1, Comparative examples 1 to 3 were examples in which BN was contained as their main phases, ZrO$_2$ and/or Si$_3$N$_4$ were contained, but their contents of SiC were low, or they did not contain SiC, and thus their volume resistivities became excessively high. In Comparative example 4, its content of BN was excessively low, and its content of hard SiC was excessively high, and thus its free-machining properties deteriorated in a micromachining test. Comparative examples 5 and 6 were examples in which C was contained rather than SiC; in Comparative example 5, its volume resistivity was excessively high, and in Comparative example 6, its free-machining properties deteriorated. Comparative example 7 was an example in which Si$_3$N4 was contained as its main phase, and TiO$_2$ was contained, but its volume resistivity was excessively high, and in addition, its free-machining properties deteriorated. In Comparative examples 8 to 10, all of their free-machining properties deteriorated.

In contrast, Examples 1 to 16 were good in both the volume resistivity and the free-machining properties. Example 16 satisfied the required qualities, but its coefficient of water absorption was as high as 0.8, and its flexural strength deteriorated to some degree. In addition, in Comparative example 6, a collapse of walls between the through holes occurred in the cutting working, but in Example 1, the through holes were successfully formed with high precision without the occurrence of such collapse, as illustrated in FIG. 3 and FIG. 4.

INDUSTRIAL APPLICABILITY

The present invention makes it possible to obtain a ceramic that is excellent in low electrostatic properties (10$^6$ to 10$^{14}$ Ω·cm in volume resistivity) and free-machining properties, which is thus useful particularly to a probe guiding member, a probe card, and a socket for inspection.

The invention claimed is:

1. A ceramic comprising, in mass %:
   BN: 20.0 to 45.0%;
   SiC: 5.0 to 40.0%; and
   ZrO$_2$ and/or Si$_3$N$_4$: 3.0 to 60.0%, and wherein the ceramic has flexural strength of 200 MPa or more.

2. The ceramic according to claim 1, wherein the ceramic has a coefficient of thermal expansion at −50 to 500° C. of 1.0×10$^{-6}$ to 5.0×10$^{-6}$/° C.

3. The ceramic according to claim 2, wherein the ceramic has a volume resistivity of 10$^6$ to 10$^{14}$ Ω·cm.

4. The ceramic according to claim 3, wherein the ceramic has a coefficient of water absorption of 0.5% or less.

5. A probe guiding member that guides probes of a probe card, the probe guiding member comprising:
   a plate-shaped main body that is made of the ceramic according to claim 4; and
   the main body includes a plurality of through holes and/or slits through which the probes are to be inserted.

6. A probe guiding member that guides probes of a probe card, the probe guiding member comprising:
   a plate-shaped main body that is made of the ceramic according to claim 3; and
   the main body includes a plurality of through holes and/or slits through which the probes are to be inserted.

7. The ceramic according to claim 2, wherein the ceramic has a coefficient of water absorption of 0.5% or less.

8. A probe guiding member that guides probes of a probe card, the probe guiding member comprising:
   a plate-shaped main body that is made of the ceramic according to claim 7; and
   the main body includes a plurality of through holes and/or slits through which the probes are to be inserted.

9. A probe guiding member that guides probes of a probe card, the probe guiding member comprising:
   a plate-shaped main body that is made of the ceramic according to claim 2; and
   the main body includes a plurality of through holes and/or slits through which the probes are to be inserted.

10. The ceramic according to claim 1, wherein the ceramic has a volume resistivity of $10^6$ to $10^{14}$ Ω·cm.

11. The ceramic according to claim 10, wherein the ceramic has a coefficient of water absorption of 0.5% or less.

12. A probe guiding member that guides probes of a probe card, the probe guiding member comprising:

a plate-shaped main body that is made of the ceramic according to claim 11; and the main body includes a plurality of through holes and/or slits through which the probes are to be inserted.

13. A probe guiding member that guides probes of a probe card, the probe guiding member comprising:

a plate-shaped main body that is made of the ceramic according to claim 10; and the main body includes a plurality of through holes and/or slits through which the probes are to be inserted.

14. The ceramic according to claim 1, wherein the ceramic has a coefficient of water absorption of 0.5% or less.

15. A probe guiding member that guides probes of a probe card, the probe guiding member comprising:

a plate-shaped main body that is made of the ceramic according to claim 14; and the main body includes a plurality of through holes and/or slits through which the probes are to be inserted.

16. A probe guiding member that guides probes of a probe card, the probe guiding member comprising:

a plate-shaped main body that is made of the ceramic according to claim 1; and the main body includes a plurality of through holes and/or slits through which the probes are to be inserted.

17. A probe card comprising:

a plurality of probes; and the probe guiding member according to claim 16.

18. A socket for package inspection, wherein the socket for package inspection is made of the ceramic according to claim 1.

19. A ceramic comprising, in mass %:

BN: 36.0 to 55.0%;

SiC: 5.0 to 40.0%; and $Si_3N_4$: 60.0% or less; and optionally comprising:

$ZrO_2$: 60.0% or less, where the total contents of $Si_3N_4$ and $ZrO_2$ is 3.0 to 60.0%, and wherein the ceramic has flexural strength of 200 MPa or more.

20. A ceramic comprising, in mass %:

BN: 25.0 to 55.0%;

SiC: 5.0 to 40.0%; and $Si_3N_4$: 16.6% or less; and optionally comprising:

$ZrO_2$: 60.0% or less, where the total contents of $Si_3N_4$ and $ZrO_2$ is 3.0 to 60.0%, and wherein the ceramic has flexural strength of 200 MPa or more.

* * * * *